United States Patent
Kim et al.

(10) Patent No.: US 9,608,233 B2
(45) Date of Patent: Mar. 28, 2017

(54) DISPLAY DEVICE

(71) Applicant: SAMSUNG DISPLAY CO., LTD., Yongin-si, Gyeonggi-do (KR)

(72) Inventors: Yunho Kim, Asan-si (KR); Gowoon Kang, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/885,104

(22) Filed: Oct. 16, 2015

(65) Prior Publication Data

US 2016/0111682 A1    Apr. 21, 2016

(30) Foreign Application Priority Data

Oct. 20, 2014    (KR) .................. 10-2014-0141893

(51) Int. Cl.
| | | |
|---|---|---|
| *H01L 51/00* | (2006.01) | |
| *H01L 51/52* | (2006.01) | |
| *H01L 27/32* | (2006.01) | |
| *G02F 1/1333* | (2006.01) | |

(52) U.S. Cl.
CPC ...... *H01L 51/5253* (2013.01); *H01L 27/3244* (2013.01); *H01L 51/0096* (2013.01); *G02F 2001/133302* (2013.01); *G02F 2201/50* (2013.01)

(58) Field of Classification Search
CPC ................ H01L 51/5253; H01L 51/0096
See application file for complete search history.

(56) References Cited

U.S. PATENT DOCUMENTS

2014/0132148 A1    5/2014    Jang et al.

FOREIGN PATENT DOCUMENTS

| KR | 10-2010-0047384 A | 5/2010 |
|---|---|---|
| KR | 10-2011-0012580 A | 2/2011 |
| KR | 10-2011-0075229 A | 7/2011 |

*Primary Examiner* — Douglas Menz
(74) *Attorney, Agent, or Firm* — Knobbe Martens Olson & Bear LLP

(57) ABSTRACT

A display device comprises a substrate comprising a first surface and a second surface facing away from the first surface; a protection layer disposed over and bonded to the first surface of the substrate; and a plurality of pixels formed over the second surface of the substrate. The protection layer comprises a concave-convex pattern.

12 Claims, 6 Drawing Sheets

DISPLAY DEVICE

CROSS-REFERENCE TO RELATED APPLICATION

This application claims priority to and the benefit of Korean Patent Application No. 10-2014-0141893, filed on Oct. 20, 2014, with the Korean Intellectual Property Office, the disclosure of which is incorporated herein in its entirety by reference.

BACKGROUND

1. Field

The present disclosure relates to a display device and a method of manufacturing the display device.

2. Description of the Related Art

Flat display panels, such as a liquid crystal display (LCD) panel, a plasma display panel (PDP), and an organic light emitting diode (OLED) display panel, generally include pixels. In order to form a pixel, a thin film transistor (TFT) circuit may be formed or an organic layer may be deposited on a bare glass, and then the pixel may be sealed by a color filter glass substrate or an encapsulation glass. In order to achieve slimness of the display panel, a mother substrate is provided in a thin profile, the mother substrate is cut into a predetermined size on a cell-by-cell basis, and then required circuit lines and a driving integrated circuit (e.g., a flexible printed circuit board (FPCB)) are attached on the substrate. Next, additional processes (e.g., examining manufactured display panels) may be performed.

It is to be understood that this background of the technology section is intended to provide useful background for understanding the technology and as such disclosed herein, the background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a display device capable of protecting a substrate with a protection layer having a concave-convex pattern.

One aspect of the invention provides a display device, which may comprise: a substrate comprising a first surface and a second surface facing away from the first surface; a protection layer disposed over and bonded to the first surface of the substrate; and a driving circuit disposed over the second surface of the substrate; and a display element on the driving circuit, wherein the protection layer comprises a concave-convex pattern.

In the foregoing device, the concave-convex pattern may comprise a plurality of protrusions and channels formed between the protrusions. Each of the protrusions may have a width in a range of about 100 μm to about 300 μm. Each of the protrusions may have a height in a range of about 5 μm to about 15 μm. The protrusions may be arranged to have a pitch in a range of about 100 μm to about 300 μm. Each of the protrusions has one of a circle, a lozenge, and a polygon in shape when viewed in a direction perpendicular to the first surface. The protection layer may have a thickness in a range of about 10 μm to about 500 μm. The protection layer may comprise at least one polymer resin of an acrylic resin, an urethane resin, an urethane acrylate resin, a silicone resin, a rubber-based resin and an epoxy resin.

Still in the foregoing device, the display device may further comprise a black film disposed over the protection layer such that the protection layer is interposed between the substrate and the black film. The concave-convex pattern may comprise a plurality of protrusions protruding toward the black film and channels formed between the protrusions and connected to each other such that air trapped between the protection layer and the black film is dispersed through the connected channels. The display device may further comprise a reflection film disposed over the protection layer such that the protection layer is interposed between the substrate and the reflection film. The concave-convex pattern may comprise a plurality of protrusions protruding toward the reflection film and channels formed between the protrusions and connected to each other such that air trapped between the protection layer and the reflection film is dispersed through the connected channels.

Yet in the foregoing device, the display element may comprise one of an organic light emitting element, a liquid crystal display element, and an electrophoretic display element. The display device may further comprise a thin film encapsulation layer disposed over the display element. The protection layer may be coated over the substrate.

Further in the foregoing device, the concave-convex pattern may be formed on a surface facing the substrate, the concave-convex pattern comprising a plurality of protrusions and channels formed between the protrusions, wherein the channels are connected to each other such that air trapped between the substrate and the protection layer is dispersed through the connected channels. The display device may further comprise another layer disposed over the protection layer such that the protection layer is interposed between the substrate and the other layer, wherein the concave-convex pattern is formed on a surface facing the other layer, the concave-convex pattern comprising a plurality of protrusions and channels formed between the protrusions, wherein the channels are connected to each other such that air trapped between the protection layer and the other layer is dispersed through the connected channels. The other layer may comprise a black film or a reflection film. The protected layer may be bonded to the substrate using an adhesive. The protected layer may be a layer printed on the substrate.

Further, aspects of embodiments of the present invention are directed to a display device reduced in quality and performance defects caused by air inclusion and thus improved in display quality.

According to an embodiment of the present invention, a display device includes: a substrate; a protection layer on one surface of the substrate; a driving circuit on another surface of the substrate; and a display element on the driving circuit. The protection layer may have a concave-convex pattern.

The protection layer may include at least one polymer resin of an acrylic resin, an urethane resin, an urethane acrylate resin, a silicone resin, a rubber-based resin and an epoxy resin.

The concave-convex pattern may have a width in a range of about 100 to 300 μm.

The concave-convex pattern may have a height in a range of about 5 to 15 μm.

The concave-convex pattern may have a pitch in a range of about 100 to 300 μm.

The concave-convex pattern may be a circle, a lozenge, and a polygon in shape.

The protection layer may have a thickness in a range of about 10 to 500 μm.

The display device may further include a black film on the protection layer.

The display device may further include a reflection film on the protection layer.

The display element may be one of an organic light emitting element, a liquid crystal display element, and an electrophoretic display element.

The display device may further include a thin film encapsulation layer on the display element.

According to embodiments of the present invention, a display device may include a protection layer having a concave-convex pattern to minimize or reduce defects caused by air inclusion, thereby improved in visibility and display quality.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Figure 1:
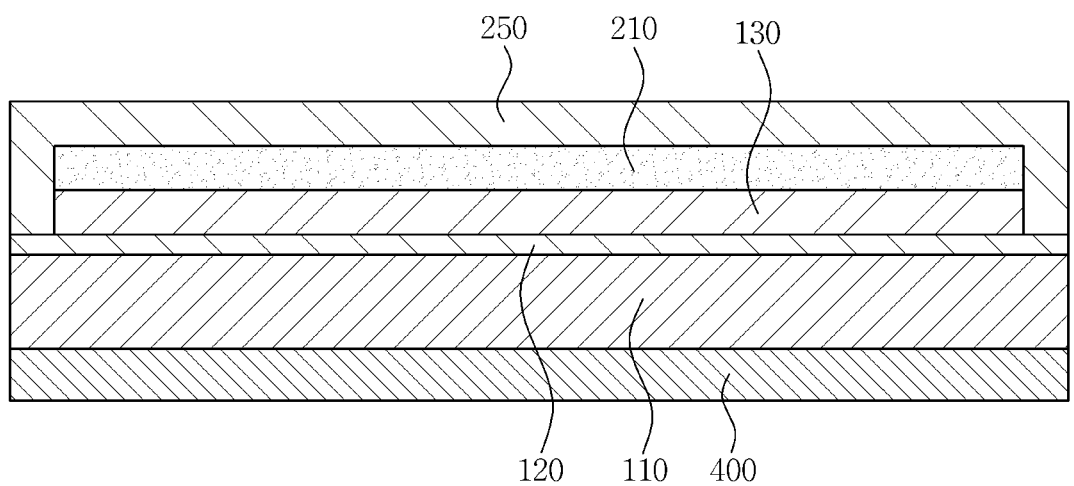
FIG. 1 is a cross-sectional view illustrating a display device according to an embodiment.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

All terminologies used herein are merely used to describe embodiments of the inventive concept and may be modified according to the relevant art and the intention of an applicant. Therefore, the terms used herein should be interpreted as having a meaning that is consistent with their meanings in the context of the present disclosure, and is not intended to limit the invention. As used herein, the singular forms "a," "an," and "the" are intended to include the plural forms as well, unless the context clearly indicates otherwise. As used herein, the term "and/or" includes any and all combinations of one or more of the associated listed items. Expressions such as "at least one of," when preceding a list of elements, modify the entire list of elements and do not modify the individual elements of the list. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

When a number of such processes are performed to manufacture a display panel, a substrate of the display panel may be scratched, thereby causing rigidity deterioration of the substrate. With the trend of an ultra-thin display panel with a thickness less than 0.8 mm, when the substrate is scratched, damage and defect rates of the display panel may be increased due to rigidity deterioration of the substrate.

To minimize or reduce the scratches, a resin film may be thinly printed on a rear surface of the display panel to proceed with further processes. Accordingly, rigidity of the display panel may be improved, and thus defect rates can be significantly reduced.

Meanwhile, functional films (e.g., a black film for preventing show-through phenomenon or a reflection film for reflecting light toward an image display direction) may be further attached on a rear surface of the display. Such attaching processes may cause air inclusion. The entrapped air may be visible, when viewing the display device from the front side.

Hereinafter, a display device according to an embodiment will be described with reference to FIGS. 1 to 5B.

As illustrated in FIG. 1, the display device according to an embodiment may include a substrate 110, a protection layer 400 disposed on a first surface of the substrate 110, a driving circuit 130 formed over a second surface of the substrate 110, and a plurality of display elements or an array of pixels 210 formed over the driving circuit 130. Herein, the first surface of the substrate 110 may refer to a surface on which the protection layer 400 is disposed and the second surface thereof may refer to a surface on which the display element 210 is disposed. However, the present invention is not limited thereto, and the first surface and the second surface of the substrate 110 may be interchangeable.

The substrate 110 may include glass, transparent flexible materials, or opaque insulating materials. The transparent flexible material may include, for example, polyimide, polyetherimide (PEI), and polyethleneterepthalate (PET). In the case of a bottom-emission type where an image is displayed toward the substrate 110, the substrate 110 may be transparent. In contrast, in the case of a top-emission type, the substrate 110 may not be transparent and may include various materials.

When a protection film including an adhesive layer is used to protect the substrate 110, a process of attaching the protection film may cause air inclusion that may disadvantageously affect visibility. The air inclusion may be produced in a row between the substrate 110 and the protection film to thereby form a trapped air line.

In contrast, as the protection layer 400 is formed on the substrate 110 according to embodiments of the present invention, air inclusion or air lines may not be produced in the display device.

Figure 4:
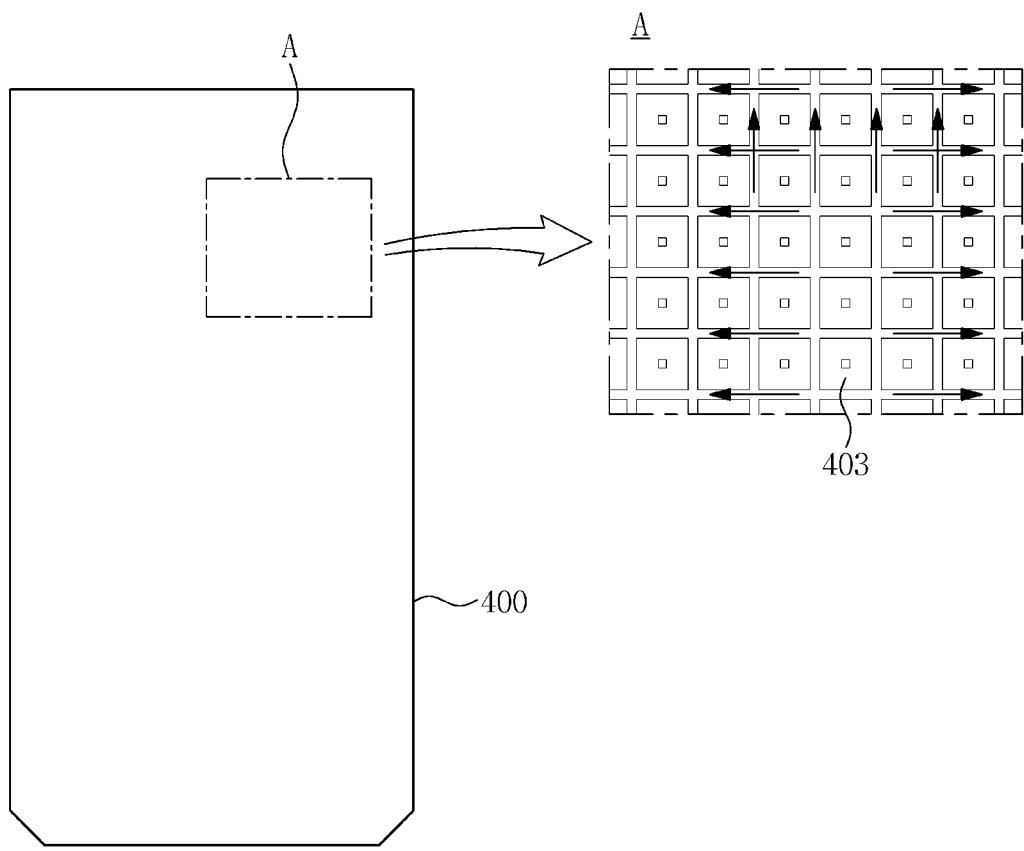
FIG. 4 is a plan view illustrating a rear surface of a display device according to an embodiment.

FIG. 4 illustrates a rear surface of a display device which is a surface of the protection layer 400.

FIG. 4 is a plan view illustrating, for ease of description, one surface of the protection layer 400 that is a rear surface of the display device. Over another surface of the protection layer 400, the substrate 110, a barrier layer 120, the driving circuit 130, the display element 210, a thin film encapsulation layer 250, and the like may be sequentially laminated.

The protection layer 400 may include a polymer resin 401 and a concave-convex pattern 403 formed on a surface thereof. The polymer resin 401 is configured to reduce or minimize scratching or contamination of the substrate 110. The concave-convex pattern 403 may impart adhesion stability, when additional layers are attached to the substrate 110.

In detail, referring to an enlarged view of FIG. 4 illustrating part A of the protection layer 400, an air path may be formed due to the concave-convex pattern 403. Air generated or trapped in attaching processes may be released through the air path, thereby improving adhesion and visibility of the display device. An arrow of FIG. 4 is illustrated, as an example, to describe the air path, but movement of air is not limited thereto.

The polymer resin 401 used in the protection layer 400 may include acrylic resins, urethane resins, urethane acrylate resins, silicone resins, rubber-based resins, and epoxy resins, which may be used solely or in combination with each other.

Figure 5A:
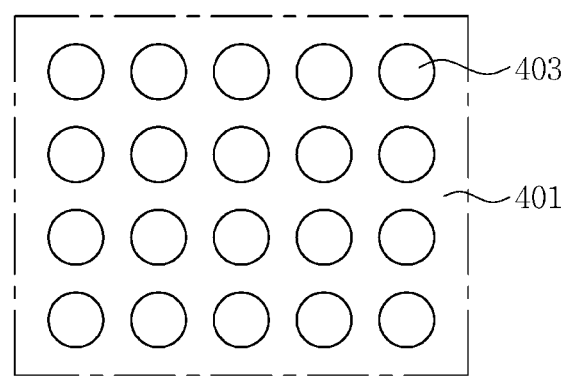
FIGS. 5A and 5B are plan views illustrating a concave-convex pattern of a protection layer according to an embodiment.
Figure 5B:
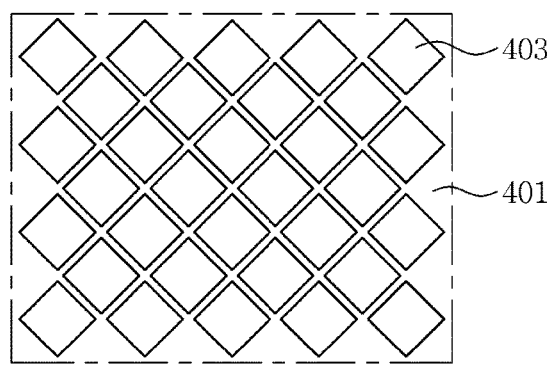

As illustrated in FIGS. 5A to 5B, the concave-convex pattern 403 may be formed on a surface of the polymer resin layer 401. In embodiments, the concave-convex pattern 403 may include an array of protrusions, each of which is, for example, a quadrangle (FIG. 4), a circle (FIG. 5A), a lozenge (FIG. 5B), and a polygon in shape, but is not limited to the specific shape.

It is desirable that the size of the protrusion of the concave-convex pattern 403 is about 100 μm to about 300 μm in width and about 5 μm to about 15 μm in height. When the width and height of the protrusion of the concave-convex pattern 403 is too small, it is difficult to form a release path of entrapped air. When the width and height thereof, however, is too big, the protection layer 400 may not be thin and even. Further, the array of protrusions of the concave-convex pattern 403 may have a pitch of about 100 μm to about 300 μm.

When a protection film including an adhesive layer is used to protect the substrate 110, it may not be easy to adjust the thickness of the protection film. In contrast, the thickness of the protection layer 400 according to an embodiment may be easily adjusted in a range of about 10 μm to 500 μm.

The protection layer 400 may be about 10 μm to 500 μm in thickness. When the protection layer 400 is more than 10 μm in thickness, it is possible that the layer 400 protects the substrate from external damages, such as scratches. Further, when the protection layer 400 is less than 500 μm in thickness, it is still possible to achieve thinness of the display device. In embodiments of a large display device, a protection layer 400 may have a thickness more than 500 μm.

The display element 210 may be one of an OLED, an LCD device, and an electrophoretic display (EPD) device. Such a display element may include a TFT in common. Accordingly, a plurality of thin-film processes is to be performed to manufacture a display device.

Hereinafter, a structure of a display device including an OLED 210 as the display element 210 will be described with reference to FIG. 1.

Referring to FIG. 1, a driving circuit 130 may be provided on or over the substrate 110 to drive the display element 210. The driving circuit 130 may include TFTs 10 and 20 (FIG. 2), and may operate the OLED 210, which is a display element according to an embodiment. In embodiments, the OLED 210 may emit light according to a driving signal applied from the driving circuit 130 to display images.

Figure 2:
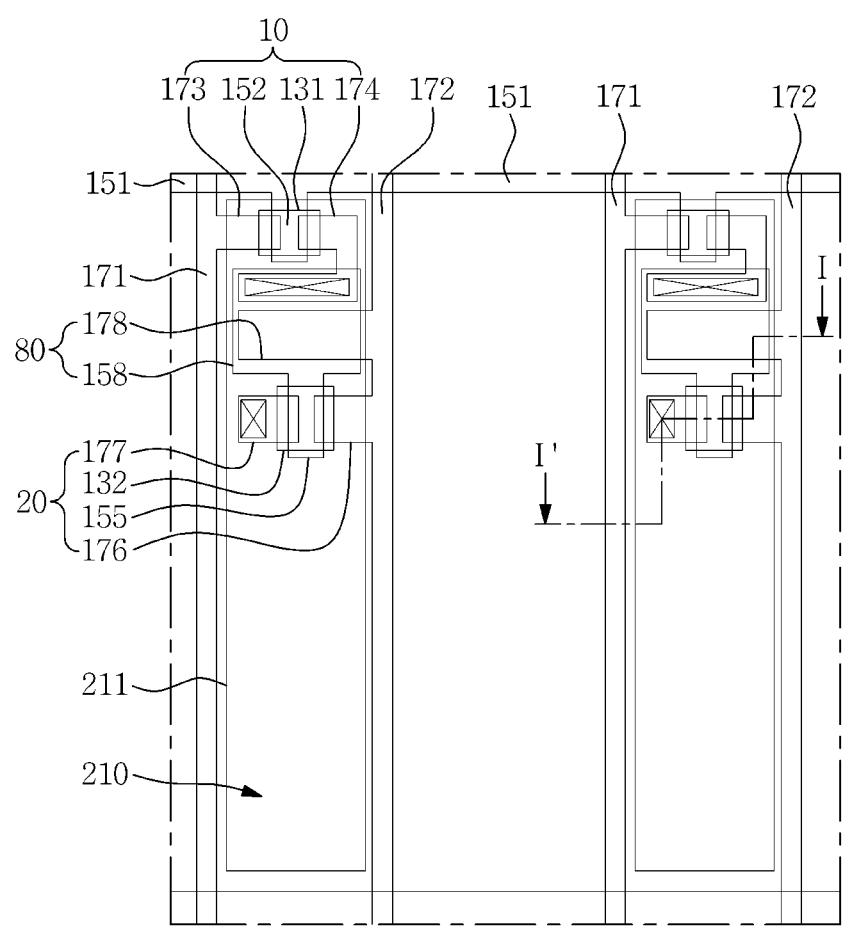
FIG. 2 is an enlarged plan view illustrating an inner structure of the display device of FIG. 1.
Figure 3:
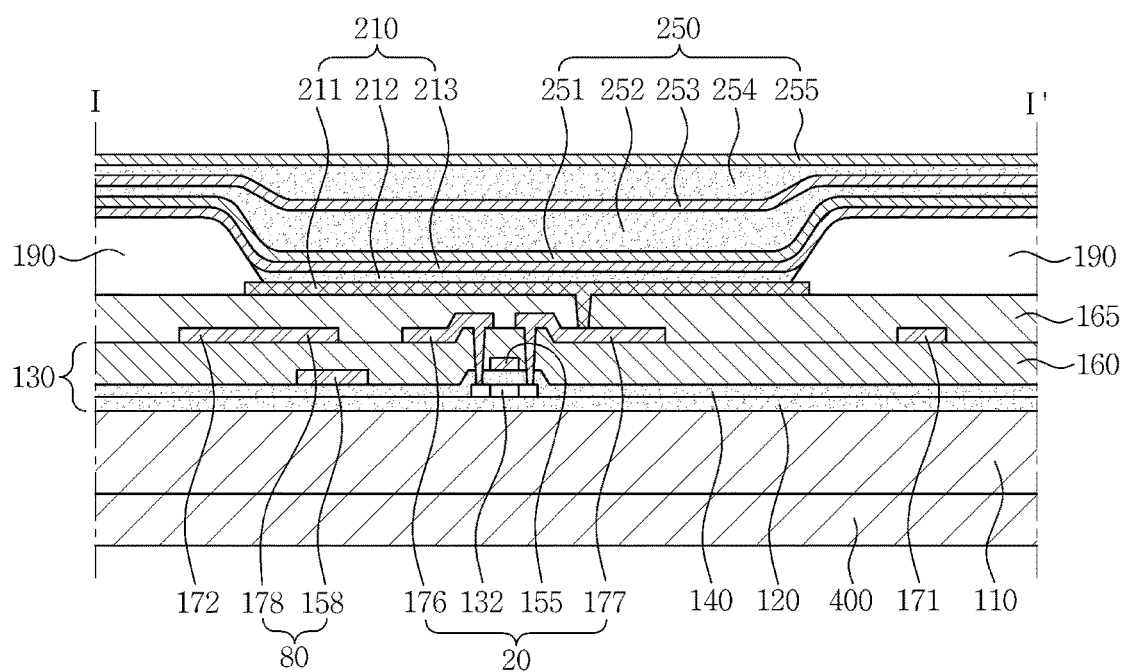
FIG. 3 is a cross-sectional view taken along line I-I' of FIG. 2.

Although detailed structures of the driving circuit 130 and the OLED 210 are illustrated in FIGS. 2 and 3, an embodiment is not limited to the structure illustrated in FIGS. 2 and 3. The driving circuit 130 and the OLED 210 may be modified into various structures that can be easily conceived by those skilled in the pertinent art.

Hereinafter, an inner structure of a display device including the OLED 210 will be described in detail with reference to FIGS. 2 and 3. FIG. 2 is a plan view illustrating a structure of a pixel and FIG. 3 is a cross-sectional view taken along line I-I' of FIG. 2.

FIGS. 2 and 3 illustrate an active-matrix (AM)-type OLED device having a 2Tr-1Cap structure. For example, the 2Tr-1Cap structure includes two TFTs 10 and 20 and a capacitor 80 in each pixel, but the present invention is not limited thereto. For example, the display device according to an embodiment may include three or more TFTs and two or more capacitors 80 in one pixel, and may further include additional lines. Herein, the term "pixel" refers to the smallest unit for displaying an image, and the display area displays an image using a plurality of pixels.

As illustrated in FIGS. 2 and 3, each pixel may include the switching TFT 10, the driving TFT 20, the capacitor 80, and the OLED 210. Herein, a structure including the switching TFT 10, the driving TFT 20, and the capacitor 80 is called a driving circuit 130. Further, the driving circuit 30 may include a gate line 151 disposed along one direction, a data line 171 and a common power line 172 insulated from and intersecting the gate line 151. Herein, each pixel region may be defined by the gate, data, and common power lines 151, 171, and 172, but is not limited thereto. In some embodiments, pixel regions may be defined by a black matrix and/or a pixel defining layer.

The OLED 210 may include a first electrode 211 serving as an anode, a second electrode 213 serving as a cathode, and a light emitting layer 212 interposed between the first and second electrodes 211 and 213, but is not limited thereto.

In some embodiments, the first electrode 211 may be a cathode electrode and the second electrode 213 may be an anode electrode.

Further, the display device may be one of a top-emission type, a bottom-emission type, and a both-side-emission type.

When the display device is provided in a top-emission type, the first electrode 211 may be formed of a reflective layer and the second electrode 213 may be formed of a transflective layer. In contrast, when the display device is provided in a bottom-emission type, the first electrode 211 may be formed of a transflective layer and the second electrode 213 may be formed of a reflective layer. Further, when the display device is provided in a both-side-emission type, the first and second electrodes 211 and 213 may be formed of transparent or transflective layers.

The reflective or transflective layers may include one of magnesium (Mg), silver (Ag), gold (Au), calcium (Ca), lithium (Li), chromium (Cr), and aluminum (Al) or metal alloys thereof. In this case, whether the layer is a reflective type or a transflective type depends on the thickness. In general, the transflective layer may have a thickness less than 200 nm. Transmittance of light may be increased in accordance with a decrease in the thickness and transmittance of light may be reduced in accordance with an increase in the thickness.

The transparent layer may include indium tin oxide (ITO), indium zinc oxide (IZO), zinc oxide (ZnO), and indium oxide ($In_2O_3$).

Further, at least one of a hole injection layer HIL and a hole transporting layer HTL may be further disposed between the first electrode 211 and the light emitting layer 212 and at least one of an electron transporting layer ETL and an electron injection layer EIL may be further disposed between the light emitting layer 210 and the second electrode 213.

Likewise, the OLED 210 may respectively inject holes and electrons into the light emitting layer 212 through the first and second electrodes 211 and 213. The injected hole and electron are combined with each other to form an exciton, and then the OLED 210 may emit light by energy generated when the exciton falls from an excited state to a ground state.

The capacitor 80 may include a pair of capacitor plates 158 and 178 with an interlayer insulating layer 160 interposed therebetween. Herein, the interlayer insulating layer 160 may be a dielectric. Capacitance of the capacitor 80 may be determined by electric charges stored in the capacitor 80 and voltage across the pair of capacitor plates 158 and 178.

The switching TFT 10 includes a switching semiconductor layer 131, a switching gate electrode 152, a switching source electrode 173, and a switching drain electrode 174. The driving TFT 20 includes a driving semiconductor layer 132, a driving gate electrode 155, a driving source electrode 176, and a driving drain electrode 177. Further, a gate insulating layer 140 may be further provided to insulate the semiconductor layers 131 and 132 and the gate electrodes 152 and 155.

The switching TFT 10 may function as a switching element which selects a pixel to perform light emission. The switching gate electrode 152 may be connected to the gate line 151 and the switching source electrode 173 may be connected to the data line 171. The switching drain electrode 174 may be spaced apart from the switching source electrode 173 and connected to one capacitor plate 158.

The driving TFT 20 may apply a driving power, which allows the organic light emitting layer 233 of the OLED 210 in a selected pixel to emit light, to the first electrode 210 serving as a pixel electrode. The driving gate electrode 155 may be connected to the one capacitor plate 158 that is connected to the switching drain electrode 174. The driving source electrode 176 and another capacitor plate 178 may be respectively connected to the common power line 172. A planarizing layer 165 may be disposed on the TFTs 10 and 20 and the driving drain electrode 177 may be connected to the first electrode 211 of the OLED 210 through a contact hole formed on the planarizing layer 165.

With the above-described structure, the switching TFT 10 may be operated by a gate voltage applied to the gate line 151 and may function to transmit a data voltage applied to the data line 171 to the driving TFT 20. Voltage equivalent to a difference between a common voltage applied from the common power line 172 to the driving TFT 20 and the data voltage transmitted by (or from) the switching TFT 10 may be stored in the capacitor 80, and current corresponding to the voltage stored in the capacitor 80 may flow to the OLED 200 through the driving TFT 20, so that the OLED 200 may emit light.

Further, the display device may further include a thin film encapsulation layer 250 configured to cover the display element 210 and a barrier layer 120 disposed between the display element 210 and the substrate 110.

The thin film encapsulation layer 250 may include one or more inorganic layers 251, 253, and 255, and one or more organic layers 252 and 254. Further, the thin film encapsulation layer 250 may have a structure where inorganic layers 251, 253, and 255 and organic layers 252 and 254 are alternately laminated. In this case, the inorganic layer 251 is disposed at the lowest portion of the laminated structure. In embodiments, the inorganic layer 251 may be disposed closest to the OLED 210. As illustrated in FIG. 3, the thin film encapsulation layer 250 includes three inorganic layers 251, 253, and 255, and two organic layers 252 and 254, but the present invention is not limited thereto.

The inorganic layers 251, 253, and 255 may include one or more inorganic materials of $Al_2O_3$, $TiO_2$, ZrO, $SiO_2$, AlON, AlN, SiON, $Si_3N_4$, ZnO, and $Ta_2O_5$. The inorganic layers 251, 253, and 255 may be formed using methods such as chemical vapor deposition (CVD) or atomic layer deposition (ALD). However, an embodiment is not limited thereto, and the inorganic layers 251, 253, and 255 may be formed using various methods known to those skilled in the art.

The organic layers 252 and 254 may be made of polymer-based materials. In this case, the polymer-based materials may include, for example, acrylic resins, epoxy resins, polyimide, and polyethylene. The organic layers 252 and 254 may be formed by a thermal deposition process. The thermal deposition process for forming the organic layers 252 and 254 may be performed in a range of temperatures that do not damage the OLED 210. However, an embodiment is not limited thereto, and the organic layers 252 and 254 may be formed using various methods known to those skilled in the pertinent art.

The inorganic layers 251, 253, and 255 having a high density of thin films may prevent or efficiently reduce infiltration of, mostly, moisture or oxygen. Most moisture and oxygen infiltration into the OLED 210 may be blocked by the inorganic layers 251, 253, and 255.

Moisture and oxygen passing through the inorganic layers 251, 253, and 255 may be further blocked by the organic layers 252 and 254. The organic layers 252 and 254 show a relatively low moisture-infiltration preventing efficacy compared to the inorganic layers 251, 253, and 255. However, the organic layers 252 and 254 may also function as a buffer layer to reduce stress, caused by bending of the display device, between each layer of the organic layers 251, 253, and 255 and the organic layers 252 and 254. In embodiments, when the inorganic layers 251, 253, and 255 are formed directly on the inorganic layers 251, 253, and 255 without the organic layers 252 and 254 therebetween, the display device may be bent, thereby causing stress between the inorganic layers 251, 253, and 255 and the another inorganic layers 251, 253, and 255. Such stress may cause damage on the inorganic layers 251, 253, and 255 and may cause significant deterioration of a moisture-infiltration prevention function of the thin film encapsulation layer 250. Further, as the organic layers 252 and 254 have planarization properties, the uppermost surface of the thin film encapsulation layer 250 may be planarized.

The thin film encapsulation layer 250 may have a thickness of 10 μm or less. Therefore, the display device may be manufactured to have an overall thickness significantly small. Accordingly, as the thin film encapsulation layer 250 is provided, properties of the display device may be improved.

The barrier layer 120 may include at least one of various inorganic layers and organic layers.

The thin film encapsulation layer 250 and the barrier layer 120 may together prevent infiltration of undesired materials, such as moisture, into the OLED 210.

With the above structure, the display device according to an embodiment may prevent or efficiently reduce defects.

Hereinafter, a display device according to another embodiment is described with reference to FIG. 6.

Figure 6:
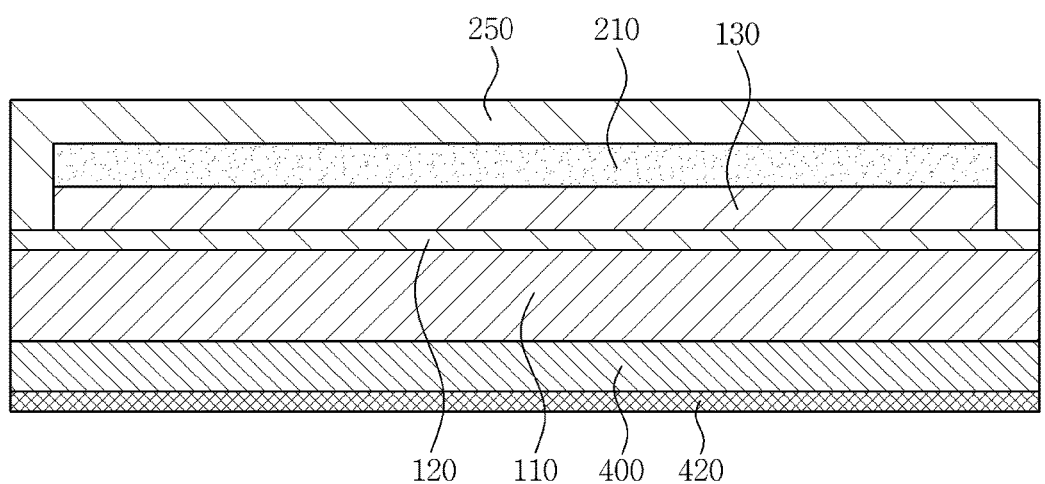
FIG. 6 is a cross-sectional view illustrating a display device according to another embodiment.

As illustrated in FIG. 6, the display device according to another embodiment may include a substrate 110, a protection layer 400 on a first surface of the substrate 110, a black film 420 on the protection layer 400, a driving circuit 130 on or over a second surface of the substrate 110, and a plurality of display elements 210 (e.g., OLEDs) or pixels over the driving circuit 130.

Herein, the first surface of the substrate 110 is a surface on which the protection layer 400 is disposed and the second surface thereof is a surface over which the display element 210 is disposed, but the first surface and the second surface of the substrate 130 may be interchangeable. Further, the display device may further include a thin film encapsulation layer 250 configured to cover the display element 210.

The display device according to the present embodiment may further include the black film 420, compared to the display device according to an embodiment illustrated in FIG. 1. The repeated description that is identical to an embodiment of FIG. 1 will be omitted for conciseness.

The black film 420 may be attached to the protection layer, thereby preventing or reducing show-through phenomenon of a rear surface of the OLED display. As illustrated in FIG. 6, the black film 420 may be attached on the protection layer 400. Then, the concave-convex pattern formed on the protection layer 400 may prevent or efficiently reduce defects of air inclusion, thereby providing stable adhesion.

A black film having a concave-convex pattern may be used for stable adhesion, but the black film having a concave-convex pattern may be expensive and would not be suitable for safekeeping. According to the present embodiment, however, the protection layer 400 includes a concave-convex pattern, and thus any black film that is easily available in the market can be used without limitation.

The black film 420 may also prevent undesirable light leakage, in addition to preventing the show-through phenomenon of the rear surface. In embodiments, the black film 420 may function as a light blocking member, thereby preventing light emitted from the light emitting layer 212 of each sub-pixel R, G, and B from leaking toward the substrate 110.

Accordingly, light emitted from the light emitting layer 212 may be emitted only toward the thin film encapsulation layer 250, which is a desired direction, thereby improving light extraction efficiency. Herein, a first electrode 211 may be an anode electrode and a second electrode 213 may be a cathode electrode. Further, the OLED display according to the present embodiment may be a top-emission type, in which light is emitted toward the second electrode 213 serving as a cathode electrode.

As described above, the black film 420 may prevent the show-through phenomenon of the rear surface and may also prevent or reduce deterioration of the light extraction efficiency as well.

Hereinafter, yet another embodiment of the present invention is described with reference to FIGS. 7 and 8.

Figure 7:
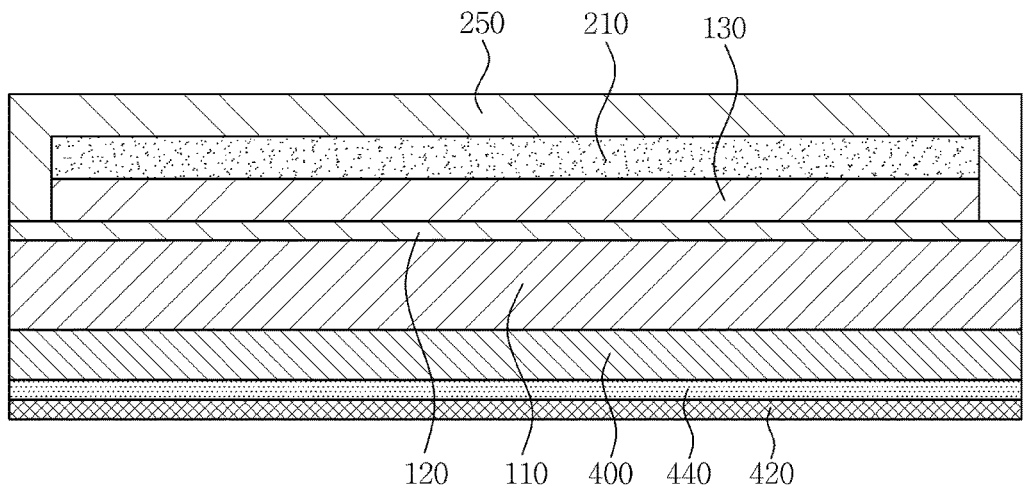
FIG. 7 is a cross-sectional view illustrating a display device according to yet another embodiment.
Figure 8:
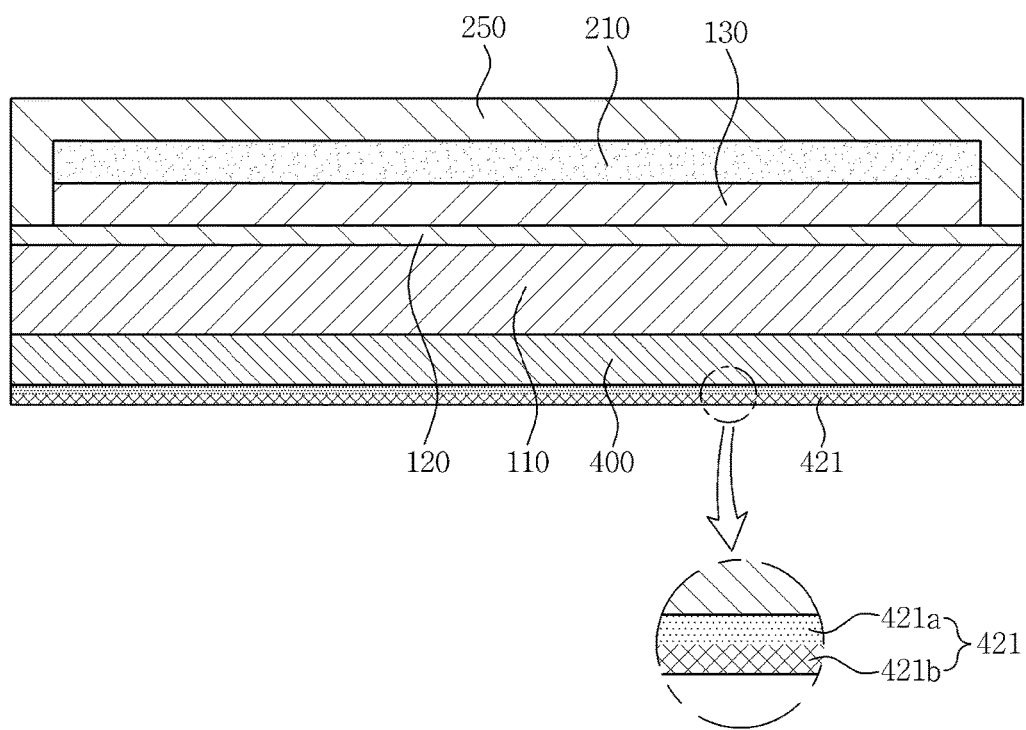
FIG. 8 is a cross-sectional view illustrating a display device according to yet another embodiment.

FIG. 7 illustrates a display device according to yet another embodiment. According to the previous embodiment, only the black film 420 is attached to the display device. According to the present embodiment, a reflection film 440 may be attached, as illustrated in FIG. 7, to the display device along with the black film 420. In embodiments, the reflection film 440 may be attached over an outer surface of the substrate 110 which is in the opposite side from the light emission direction.

Accordingly, the black film 420 may firstly prevent light leakage and then the reflection film 440 may reflect light emitted toward the substrate 110 frontwards, thereby improving frontward light extraction efficiency. Accordingly, a display device with the above-described structure may be improved in stable adhesion, visibility, and light extraction efficiency with high reliability.

The type of the reflection film 440 is not limited, and any reflection films may be applied. The repeated description of the black film 420 will be omitted for conciseness.

Meanwhile, the structure of the embodiment illustrated in FIG. 7 may increase the thickness of the product, since the reflection film 440 and the black film 420 are attached as separate members. To avoid such possibility of thickness increase, the structure of yet another embodiment illustrated in FIG. 8 may be used, in which a reflection film 421a is integrally formed with one surface of the black film 421 into a single unit. In embodiments, when an integral black film 421 including the reflective layer 421a and the black layer 421b is used, a display device may be improved in stable adhesion, visibility, and light extraction efficiency as in the embodiment illustrated in FIG. 7, and may also achieve slimness.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A display device comprising:
 a substrate comprising a first surface and a second surface facing away from the first surface;
 a protection layer disposed over and bonded to the first surface of the substrate;

a driving circuit disposed over the second surface of the substrate; and a display element on the driving circuit, wherein the protection layer comprises a concave-convex pattern.

2. The display device of claim 1, wherein the concave-convex pattern comprises a plurality of protrusions and channels formed between the protrusions.

3. The display device of claim 2, wherein each of the protrusions has a width in a range of about 100 μm to about 300 μm.

4. The display device of claim 2, wherein each of the protrusions has a height in a range of about 5 μm to about 15 μm.

5. The display device of claim 2, wherein the protrusions are arranged to have a pitch in a range of about 100 μm to about 300 μm.

6. The display device of claim 2, wherein each of the protrusions has one of a circle, a lozenge, and a polygon in shape.

7. The display device of claim 1, wherein the protection layer has a thickness in a range of about 10 μm to about 500 μm.

8. The display device of claim 1, wherein the protection layer comprises at least one polymer resin of an acrylic resin, an urethane resin, an urethane acrylate resin, a silicone resin, a rubber-based resin and an epoxy resin.

9. The display device of claim 1, further comprising a black film disposed over the protection layer.

10. The display device of claim 1, further comprising a reflection film disposed over the protection layer.

11. The display device of claim 1, wherein the display element is one of an organic light emitting element, a liquid crystal display element, and an electrophoretic display element.

12. The display device of claim 1, further comprising a thin film encapsulation layer disposed over the display element.

* * * * *